US011252801B2

(12) United States Patent
Li

(10) Patent No.: US 11,252,801 B2
(45) Date of Patent: Feb. 15, 2022

(54) CONTROL CIRCUIT AND CONTROL METHOD WITH FIXED BLEED TIME

(71) Applicant: SHENZHEN SUNMOON MICROELECTRONICS CO., LTD., Guangdong (CN)

(72) Inventor: Zhaohua Li, Guangdong (CN)

(73) Assignee: SHENZHEN SUNMOON MICROELECTRONICS CO., LTD., Guangdong (CN)

(*) Notice: Subject to any disclaimer, the term of this patent is extended or adjusted under 35 U.S.C. 154(b) by 51 days.

(21) Appl. No.: 16/652,637

(22) PCT Filed: Apr. 28, 2019

(86) PCT No.: PCT/CN2019/084831
§ 371 (c)(1),
(2) Date: Mar. 31, 2020

(87) PCT Pub. No.: WO2020/211116
PCT Pub. Date: Oct. 22, 2020

(65) Prior Publication Data
US 2021/0243864 A1 Aug. 5, 2021

(30) Foreign Application Priority Data

Apr. 16, 2019 (CN) .......................... 201910304441.3
Apr. 16, 2019 (CN) .......................... 201920519975.3

(51) Int. Cl.
H05B 45/3575 (2020.01)
H03K 17/687 (2006.01)

(52) U.S. Cl.
CPC ....... H05B 45/3575 (2020.01); H03K 17/687 (2013.01)

(58) Field of Classification Search
CPC ........ H05B 45/00; H05B 45/10; H05B 45/14; H05B 45/30; H05B 45/3575
See application file for complete search history.

(56) References Cited

U.S. PATENT DOCUMENTS 8,154,221 B2* 4/2012 Godbole ................ H05B 45/31
315/307
9,559,675 B1* 1/2017 Peng .................. H02M 3/33507
(Continued)

FOREIGN PATENT DOCUMENTS

CN 102332899 A 1/2012
CN 109041348 A 12/2018

OTHER PUBLICATIONS

The extended European search report issued in European Application No. 19861278.0, dated Jun. 4, 2021.

Primary Examiner — Jason Crawford
(74) Attorney, Agent, or Firm — Hamre, Schumann, Mueller & Larson, P.C.

(57) ABSTRACT

The present application provides a control circuit and a control method with fixed bleed time, a trigger signal is obtained and transmitted via a detection module; a timing module starts timing upon receiving the trigger signal, and outputs an end-of-timing signal when a preset time is reached; a control module outputs a control signal according to the end-of-timing signal; a bleeder module bleeds off a current within the preset time according to the control signal; and when the control circuit is powered off, the detection module, timing module, control module and bleeder module automatically perform a power-off reset.

6 Claims, 2 Drawing Sheets

(56) References Cited

U.S. PATENT DOCUMENTS

| | | | |
|---|---|---|---|
| 2012/0242238 A1* | 9/2012 | Chen | H05B 45/3725 |
| | | | 315/200 R |
| 2013/0043726 A1* | 2/2013 | Krishnamoorthy | H05B 47/19 |
| | | | 307/31 |
| 2013/0242625 A1* | 9/2013 | Yan | H05B 45/14 |
| | | | 363/49 |
| 2016/0323944 A1* | 11/2016 | Chen | H05B 45/10 |
| 2018/0139816 A1* | 5/2018 | Liu | H05B 45/10 |
| 2018/0219549 A1 | 8/2018 | Prabhat et al. | |
| 2018/0295685 A1 | 10/2018 | Wang et al. | |
| 2018/0295690 A1* | 10/2018 | Chen | H05B 45/3575 |
| 2018/0310376 A1 | 10/2018 | Huang et al. | |
| 2019/0124736 A1* | 4/2019 | Zhu | H05B 45/395 |
| 2019/0208591 A1* | 7/2019 | Chen | H05B 45/10 |

\* cited by examiner

CONTROL CIRCUIT AND CONTROL METHOD WITH FIXED BLEED TIME

CROSS REFERENCE TO RELATED APPLICATIONS

This application is a 35 U.S.C. § 371 national stage application of PCT Application Ser. No. PCT/CN2019/084831 filed on Apr. 28, 2019, which claims priority to the Chinese Patent Application Ser. No. 201910304441.3 filed on Apr. 16, 2019 and the Chinese Patent Application Ser. No. 201920519975.3 filed on Apr. 16, 2019, the entire contents of which are incorporated herein by reference.

TECHNICAL FIELD

The present application relates to the technical field of electronic circuits, and more particularly to a control circuit and a control method with fixed bleed time.

BACKGROUND

In a control system for the electronic circuit, a minimum sustaining current is required for maintaining a thyristor in an on state when the thyristor is connected, and if the current of the control system is less than the minimum sustaining current, the thyristor will be turned off. Optionally, in the field of LED dimming, especially in the field of LED dimming with thyristor for dimming, when the voltage of the wire netoperate is less than the LED on-voltage, an additional bleed-off current is required, if the thyristor needs to be sustained in a normal on state, for maintaining the thyristor in a normal on state; if a bleed-off current path is always on, the efficiency of the system would be affected.

Therefore, the conventional technology has a problem of low efficiency due to the inability to control the time period of a bleed-off current.

Technical Problem

An object of this application is to provide a control circuit and a control method with fixed bleed time, which aims to solve the problem of low efficiency due to the inability to control the time period of the bleed-off current existed in the conventional technology.

Technical Applications

A first aspect of the present application provides a control circuit with fixed bleed time, the control circuit includes:

a detection module being connected with an output of a rectifier, and configured to obtain and transmit a trigger signal;

a timing module being connected with the detection module, and configured to start timing upon receiving the trigger signal, and output an end-of-timing signal when a preset time is reached;

a control module being connected with the timing module, and configured to output a control signal according to the end-of-timing signal; and a bleeder module being connected with the control module, and configured to bleed off a current within the preset time according to the control signal.

A second aspect of the present application provides a control method with fixed bleed time, the control method includes:

obtaining, via a detection module, a trigger signal and transmitting the same;

starting, via a timing module, timing upon after receiving the trigger signal, and outputting an end-of-timing signal when a preset time is reached;

outputting, via a control module, a control signal according to the end-of-timing signal;

bleeding off, via a bleeder module, a current within the preset time according to the control signal.

Beneficial Effect

The present application provides a control circuit and a control method with fixed bleed time, which includes a detection module, a timing module, a control module, and a bleeder module, a trigger signal may be obtained and transmitted via the detection module; the timing module starts timing upon receiving the trigger signal, and outputs an end-of-timing signal when a preset time is reached; the control module outputs a control signal according to the end-of-timing signal; the bleeder module bleeds off a current within the preset time according to the control signal; and when the control circuit is powered off, the detection module, timing module, control module and bleeder module automatically perform a power-off reset. Whereby all modules can perform a new round of logic control after the power-off reset; with the fixed bleed time, the system can achieve a higher efficiency when the thyristor opens at the maximum angle, and during a thyristor dimming process, the thyristor can be maintained in a normal on state via a bleed-off current when the main path current is lower than the sustaining current of the thyristor, so that the system operates normally. Thereby solving the problem of low efficiency due to the inability to control the time period of the bleed-off current existed in the conventional technology.

DETAILED DESCRIPTION OF THE EMBODIMENTS

In order to make objectives, technical solutions and advantages of the present application more comprehensible, the present application is further described in detail herebelow with reference to the accompanying drawings and embodiments. It should be understood that the specific embodiments described herein are merely used to illustrate the present application, and are not intend to limit the present application.

The above-mentioned control circuit and control method for the fixed bleed time includes a detection module, a timing module, a control module and a bleeder module, a trigger signal may be obtained and transmitted via the detection module; the timing module starts timing upon receiving the trigger signal, and outputs an end-of-timing signal when a preset time is reached; the control module outputs a control signal according to the end-of-timing signal; the bleeder module bleeds off a current within the preset time according to the control signal; and when the control circuit is powered off, the detection module, timing module, control module and bleeder module automatically perform a power-off reset. This achieves a new round of logic control performed by all modules after the power-off reset; with the fixed bleed time, the system can achieve a higher efficiency when the thyristor opens at the maximum angle, and during a thyristor dimming process, the thyristor can be maintained in a normal on state via a bleed-off current when the main path current is lower than the sustaining current of the thyristor, so that the system operates normally.

Figure 1:
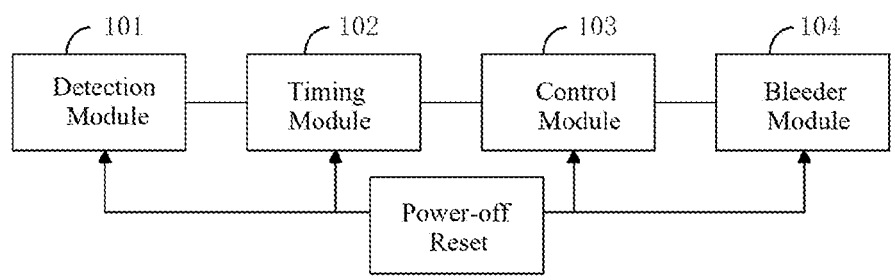
FIG. 1 is a schematic diagram of a module structure of a control circuit with fixed bleed time provided by an embodiment of the present application.

FIG. 1 shows a module structure of the control circuit for the fixed bleed time provided by an embodiment of the present application. For convenience of illustration, only the parts related to this embodiment are shown, and the details are illustrated as follows:

The above-mentioned control circuit for the fixed bleed time includes a detection module 101, a timing module 102, a control module 103, and a bleeder module 104.

The detection module 101 is connected with an output of a rectifier and is configured to obtain and transmit a trigger signal.

The timing module 102 is connected with the detection module 101 and is configured to start timing upon receiving a trigger signal, and output an end-of-timing signal when a preset time is reached.

The control module 103 is connected with the timing module 102 and is configured to output a control signal according to the end-of-timing signal.

The bleeder module 104 is connected with the control module 103 and is configured to bleed off a current within the preset time according to the control signal.

As an embodiment of this application, the timing module 102 is an existing module, in which the preset time can be set according to actual needs.

As an embodiment of this application, the detection module 101 is connected with the output of the rectifier, that is to say, it is indirectly connected with a switching element such as a thyristor, and obtains a trigger signal; the timing module 102 starts timing upon receiving the trigger signal, where the timer starts to calculate the starting time of the bleed-off current, and outputs an end-of-timing signal after a preset time; the control module 103, after receiving the end-of-timing signal, outputs a control signal to control the bleeder module 104 to end the bleed-off current; and when the control circuit is powered off, each of the above functional modules (including the detection module 101, the timing module 102, the control module 103 and the bleeder module 104) automatically performs a power-off reset. Therefore, with the fixed the bleed time, it is possible for the system to achieve a higher efficiency when the thyristor opens at the maximum angle, and during the thyristor dimming process, when the main circuit current is lower than the sustaining current of the thyristor, the thyristor can be maintained in a normal on state via the bleed-off current, so that the system operates normally.

Figure 2:
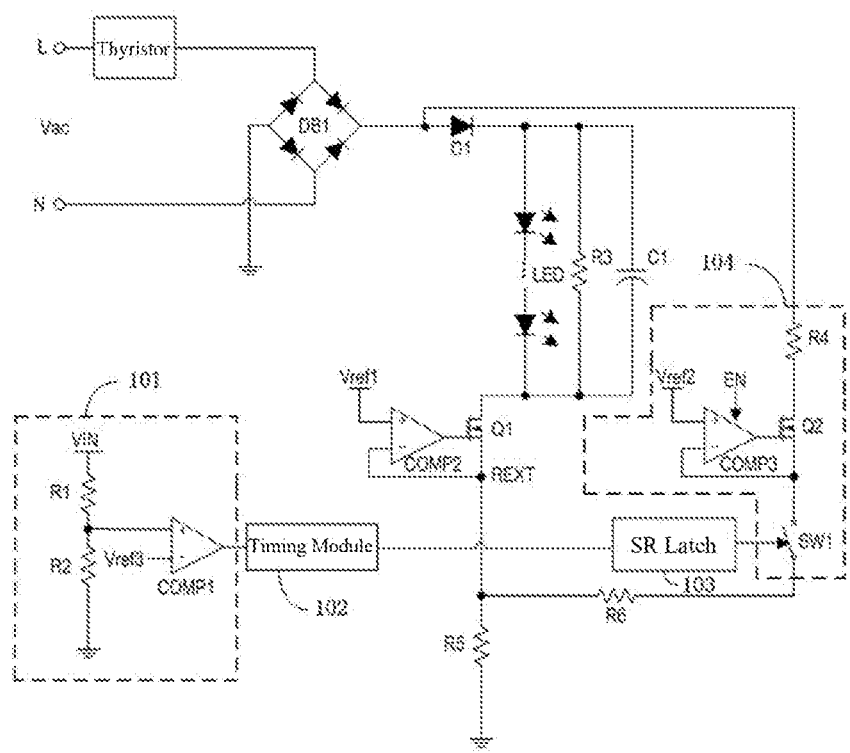
FIG. 2 is a circuit example diagram of a control circuit with fixed bleed time provided by an embodiment of the present application.

FIG. 2 shows an example circuit of the control circuit for the fixed bleed time provided by an embodiment of the present application. For convenience of illustration, only the parts related to this embodiment are shown, and the details are illustrated as follows As an embodiment of this application, the detection module 101 includes a first resistor R1, a second resistor R2 and a first comparator COMP1.

A first end of the first resistor R1 is connected with the output of the rectifier (referenced as VIN in FIG. 2). A second end of the first resistor R1 is connected in common with a first end of the second resistor R2 and a non-inverting input of the first comparator COMP1. A second end of the second resistor R2 is grounded, an inverting input of the first comparator COMP1 is connected with a third reference voltage signal Vref3, and an output of the first comparator COMP1 is connected to the timing module 102.

As an embodiment of this application, the control module 103 may be implemented by a latch, which can change a state under actions of a specific input pulse level, or temporarily store a signal to maintain a certain level state. It should be understood that the latch may include any one of a D trigger, a buffer and an SR latch. Particularly, in this embodiment, the control module 103 is implemented by an SR latch.

In addition, the control module 103 may also be implemented by a main control chip. An input of the main control chip is connected with the timing module 102, and an output of the main control chip is connected to the bleeder module 104.

As an embodiment of this application, the bleeder module 104 includes a switch SW1, a second switch Q2, a third operational amplifier COMP3 and a fourth resistor R4;

A controlled end of the switch SW1 is connected with the control module 103. A first end of the switch SW1 is grounded via the sixth resistor R6 and the fifth resistor R5. A second end of the switch SW1 is connected in common with an inverting input end of the third operational amplifier COMP3 and an output of the second switch Q2, a non-inverting input of the third operational amplifier COMP3 is connected with a second reference voltage signal Vref2, an output of the third operational amplifier COMP3 is connected with a controlled end of the second switch Q2, and an input of the second switch Q2 is connected with the first end of the fourth resistor R4, a second end of the fourth resistor R4 is connected with the anode of the first diode D1, the cathode of the first diode D1, the anode of the light emitting diode LED, a first end of the third resistor R3 and a first end of the first capacitor C1 are connected in common, and the cathode of the light emitting diode LED is connected in common with a second end of the third resistor R3 and a second end of the first capacitor C1.

Specifically, the switch SW1 includes a field effect transistor or a triode.

Specifically, the second switch Q2 includes a field effect transistor or a triode;

The drain, gate and source electrode of the field effect transistor are respectively an input, a controlled and an output end of the second switch Q2;

The collector, base and emitter electrode of the triode are respectively an input, a controlled and an output end of the second switch Q2.

As an embodiment of this application, the control circuit for the fixed bleed time also includes a first switch Q1 and a second operational amplifier COMP2;

An output of the first switch Q1 is connected to an inverting input of the second operational amplifier COMP2, a non-inverting input of the second operational amplifier COMP2 is connected with a first reference voltage signal Vref1, an output of the second operational amplifier COMP2 is connected to a controlled end of the first switch Q1, and an input end of the first switch Q1 is connected with the cathode of the light emitting diode LED.

Specifically, the first switch Q1 includes a field effect transistor or a triode;

The drain, gate and source electrode of the field effect transistor are respectively an input, a controlled and an output end of the first switch Q1;

The collector, base and emitter electrode of the triode are respectively an input, a controlled and an output end of the first switch Q1.

Figure 3:
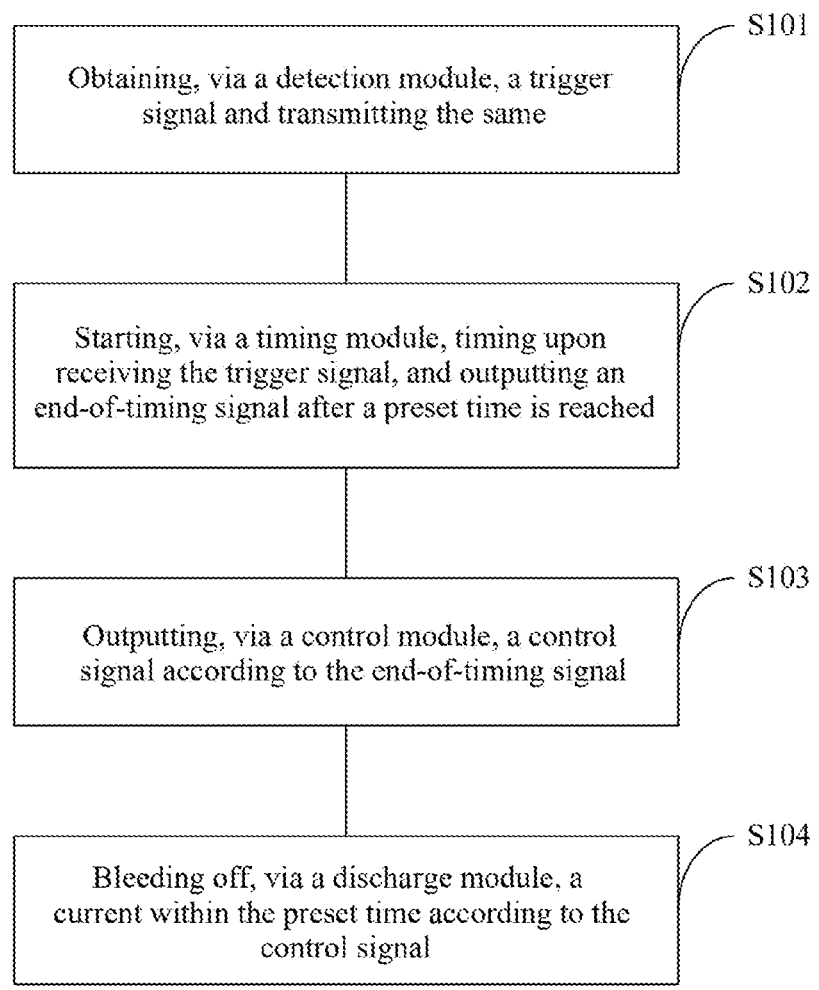
FIG. 3 is a schematic flow chart of a control method with fixed bleed time according to another embodiment of the present invention.

FIG. 3 shows steps of the control method for the fixed bleed time provided by an embodiment of the present application. For the convenience of description, only the parts related to this embodiment are shown, and the details are illustrated as follows:

This application also provides a control method with fixed bleed time, including the following steps:

S101. obtaining, via the detection module, a trigger signal and transmitting the same;

S102. starting, via the timing module, timing upon receiving the trigger signal, and outputting an end-of-timing signal when a preset time is reached;

S103. outputting, via the control module, a control signal according to the end-of-timing signal;

S104. bleeding off, via the bleeder module, a current within the preset time according to the control signal.

With reference to FIGS. 1-3, the operating principle of the control circuit and control method for the fixed bleed time are described as follows:

First, the detection point of the detection module 101 may be set at the VIN port (that is, connected with an output of a rectifier). Upon receiving a signal indicating of starting timing from the detection module 101, the timing module 102 starts its timing operation, and when the preset time is reached, an end-of-timing signal from the timing module is sent to the control module 103, where the control module 103 may be connected to a bleed-off path, optionally, it may also be connected to an EN (enable) end of the third operational amplifier COMP3 in the bleeder module 104, at this point, this logic ends. The system enters a new round of logic cycle after the power-off reset.

Specifically, a power signal is transmitted through the thyristor, after that, the power signal is rectified via a rectifier bridge DB1, and then transmitted through the first diode D1 to drive the light-emitting diode LED to light up; Due to the detection module 101, the timing module 102, the control module 103 and the bleeder module 104 are provided, such that the system has a higher efficiency when the thyristor opens at the maximum angle, and during the thyristor dimming process, when the main path current is lower than the sustaining current of the thyristor, and the thyristor can be maintained in a normal on state via the bleed-off current, so that the system operates normally.

In summary, a control circuit and a control method with fixed bleed time provided by embodiments of the present application include a detection module, a timing module, a control module, and a bleeder module, a trigger signal may be obtained and transmitted via the detection module; the timing module starts timing upon receiving the trigger signal, and outputs an end-of-timing signal when a preset time is reached; the control module outputs a control signal according to the end-of-timing signal; the bleeder module bleeds off a current within the preset time according to the control signal; and when the control circuit is powered off, the detection module, timing module, control module and bleeder module automatically perform a power-off reset. Whereby all modules can perform a new round of logic control after the power-off reset; with the fixed bleed time, the system can achieve a higher efficiency when the thyristor opens at the maximum angle, and during a thyristor dimming process, the thyristor can be maintained in a normal on state via a bleed-off current when the main path current is lower than the sustaining current of the thyristor, so that the system operates normally. Thereby solving the problem of low efficiency due to the inability to control the time period of the bleed-off current existed in the conventional technology.

The foregoing description are merely preferred embodiments of the present application, and are not intended to limit the present application; any modifications, equivalent substitutions and improvements made within the spirit and principles of the disclosure should be understood as being included within the scope of the present application.

The invention claimed is:

1. A control circuit with fixed bleed time, wherein the control circuit comprising:
   a detection module in connection with an output of a rectifier, and configured to obtain and transmit a trigger signal;
   a timing module in connection with the detection module, and configured to start timing upon receiving the trigger signal, and to output an end-of-timing signal when a preset time is reached;
   a control module in connection with the timing module, and configured to output a control signal according to the end-of-timing signal; and
   a bleeder module in connection with the control module, and configured to bleed off a current within the preset time according to the control signal,
   wherein the bleeder module comprises:
   a switch, a second switch, a third operational amplifier and a fourth resistor; and
   wherein a controlled end of the switch is connected with the control module, a first end of the switch is grounded via a sixth resistor and a fifth resistor, a second end of the switch is connected in common with an inverting input of the third operational amplifier, and an output of the second switch, a non-inverting input of the third operational amplifier is connected with a second reference voltage signal, and an output of the third operational amplifier is connected to a controlled end of the second switch, an input of the second switch is connected with a first end of the fourth resistor, and a second end of the fourth resistor is connected with a light emitting diode via a first diode.

2. The control circuit according to claim 1, wherein the detection module comprises:
   a first resistor, a second resistor and a first comparator;
   a first end of the first resistor is connected with the output of the rectifier, a second end of the first resistor is connected in common with a first end of the second resistor and a non-inverting input of the first comparator, a second end of the second resistor is grounded, an inverting input of the first comparator is connected with a third reference voltage signal, and an output of the first comparator is connected to the timing module.

3. The control circuit according to claim 1, wherein the control module is implemented by a latch.

4. The control circuit according to claim 1, wherein the second switch comprises a field effect transistor or a triode;
   the drain, gate and source electrode of the field effect transistor are respectively an input end, a controlled end and an output end of the second switch;
   the collector, base and emitter electrode of the triode are respectively an input end, a controlled end, and an output end of the second switch.

5. The control circuit according to claim 1, wherein the switch comprises a field effect transistor or a triode.

6. A control method with fixed bleed time the control method comprising:
- obtaining, via a detection module, a trigger signal and transmitting the same;
- starting, via a timing module, timing upon receiving the trigger signal, and outputting an end-of-timing signal when a preset time is reached;
- outputting, via a control module, a control signal according to the end-of-timing signal;
- bleeding off, via a bleeder module, a current within the preset time according to the control signal,
- wherein the bleeder module comprises:
  - a switch, a second switch, a third operational amplifier and a fourth resistor; and
- wherein a controlled end of the switch is connected with the control module, a first end of the switch is grounded via a sixth resistor and a fifth resistor, a second end of the switch is connected in common with an inverting input of the third operational amplifier, and an output of the second switch, a non-inverting input of the third operational amplifier is connected with a second reference voltage signal, and an output of the third operational amplifier is connected to a controlled end of the second switch, an input of the second switch is connected with a first end of the fourth resistor, and a second end of the fourth resistor is connected with a light emitting diode via a first diode.

* * * * *